(12) United States Patent
Montorsi et al.

(10) Patent No.: US 9,692,542 B2
(45) Date of Patent: Jun. 27, 2017

(54) METHOD AND SYSTEM FOR GENERATING CHANNEL CODES, IN PARTICULAR FOR A FRAME-HEADER

(71) Applicant: POLITECNICO DI TORINO, Turin (TO) (IT)

(72) Inventors: Guido Montorsi, Turin (IT); Farbod Kayhan, Shiraz (IR)

(73) Assignee: POLITECNICO DI TORINO, Turin (TO) (IT)

( * ) Notice: Subject to any disclaimer, the term of this patent is extended or adjusted under 35 U.S.C. 154(b) by 0 days.

(21) Appl. No.: 14/430,865

(22) PCT Filed: Sep. 24, 2013

(86) PCT No.: PCT/EP2013/069871
§ 371 (c)(1),
(2) Date: Mar. 24, 2015

(87) PCT Pub. No.: WO2014/048928
PCT Pub. Date: Apr. 3, 2014

(65) Prior Publication Data
US 2015/0244491 A1    Aug. 27, 2015

(30) Foreign Application Priority Data
Sep. 25, 2012  (IT) .............................. TO2012A0829

(51) Int. Cl.
*H04L 12/28*    (2006.01)
*H04J 13/10*    (2011.01)
(Continued)

(52) U.S. Cl.
CPC ........... *H04J 13/10* (2013.01); *H03M 13/251* (2013.01); *H03M 13/2906* (2013.01);
(Continued)

(58) Field of Classification Search
CPC ....... H04L 47/365; H04L 7/042; H04L 1/007; H04L 45/00; H04L 12/28; H04L 29/0653;
(Continued)

(56) References Cited

U.S. PATENT DOCUMENTS 6,381,713 B1 * 4/2002 Irvin ..................... H04L 1/0057
370/314
7,032,027 B1 * 4/2006 Meissner ................ H04L 49/90
709/230
(Continued)

FOREIGN PATENT DOCUMENTS

WO      01/55258 A1    7/2001
WO   2010/059740 A2    5/2010

OTHER PUBLICATIONS

International Search Report dated Feb. 20, 2014, issued in PCT Application No. PCT/EP2013/069871, filed Sep. 24, 2013.
(Continued)

*Primary Examiner* — Andrew Lee
(74) *Attorney, Agent, or Firm* — Workman Nydegger

(57) ABSTRACT

A method for generating a channel code, in particular for a frame-header, wherein at least a code-word of the channel code is obtained by means of at least a concatenation of code-words of two constituent codes and such concatenation is performed on subsets of code-words of a first constituent code, having maximum length, with code-words of a second constituent code.

17 Claims, 16 Drawing Sheets

(51) Int. Cl.

| | |
|---|---|
| *H04L 1/00* | (2006.01) |
| *H03M 13/25* | (2006.01) |
| *H03M 13/29* | (2006.01) |
| *H03M 13/35* | (2006.01) |
| *H04L 29/06* | (2006.01) |
| *H04W 72/04* | (2009.01) |
| *H03M 13/13* | (2006.01) |

(52) U.S. Cl.
CPC .......... *H03M 13/356* (2013.01); *H04L 1/001* (2013.01); *H04L 1/0003* (2013.01); *H04L 1/0057* (2013.01); *H04L 1/0064* (2013.01); *H04L 69/22* (2013.01); *H04W 72/0466* (2013.01); *H03M 13/136* (2013.01); *H04L 1/007* (2013.01)

(58) Field of Classification Search
CPC . H04L 2012/5652; H04B 3/54; H04M 13/136
See application file for complete search history.

(56) References Cited

U.S. PATENT DOCUMENTS

| | | | | |
|---|---|---|---|---|
| 7,856,584 | B2* | 12/2010 | Ovchinnikov | H03M 13/356 714/752 |
| 8,184,025 | B2* | 5/2012 | Lee | H03M 13/033 341/106 |
| 9,112,753 | B2* | 8/2015 | Varadarajan | H04L 27/20 |
| 2006/0176984 | A1* | 8/2006 | Lee | H04L 7/042 375/343 |
| 2006/0218459 | A1* | 9/2006 | Hedberg | H03M 13/1102 714/752 |
| 2008/0320283 | A1* | 12/2008 | Meinds | H03M 7/40 712/220 |
| 2009/0022237 | A1* | 1/2009 | Wang | H04L 1/0006 375/260 |
| 2009/0279475 | A1* | 11/2009 | Vanderaar | H04L 1/0003 370/321 |
| 2010/0195646 | A1* | 8/2010 | Lee | H04L 1/007 370/389 |
| 2011/0043391 | A1* | 2/2011 | Lee | H03M 13/033 341/106 |
| 2011/0235721 | A1* | 9/2011 | Chen | H03M 13/136 375/240.25 |
| 2011/0310978 | A1* | 12/2011 | Wu | H04N 19/44 375/240.25 |
| 2012/0307934 | A1* | 12/2012 | Heidari | H04L 1/0003 375/295 |
| 2013/0044698 | A1* | 2/2013 | Susitaival | H04W 28/06 370/329 |
| 2014/0003424 | A1* | 1/2014 | Matsuhira | H04L 47/365 370/389 |
| 2014/0376645 | A1* | 12/2014 | Kumar | H04N 19/89 375/240.27 |
| 2015/0115551 | A1* | 4/2015 | Schenk | B23B 31/1246 279/63 |
| 2015/0319272 | A1* | 11/2015 | Varadarajan | H04B 3/54 370/392 |

OTHER PUBLICATIONS

Written Opinion dated Feb. 20, 2014, issued in PCT Application No. PCT/EP2013/069871, filed Sep. 24, 2013.

* cited by examiner

| $i$ | $SNR_i$ | $n_i$ | $k_i$ | $d_s$ | $d_T$ | $N_i$ | $i \cdot N_i$ |
|---|---|---|---|---|---|---|---|
| 32 | 15 | 5 | 5 | 1 | 1 | 5 | 160 |
| 31 | 14 | 0 | 5 | 0 | 1 | 5 | 155 |
| 30 | 13 | 0 | 5 | 0 | 1 | 5 | 150 |
| 29 | 12 | 0 | 5 | 0 | 1 | 5 | 145 |
| 28 | 11 | 5 | 5 | 1 | 2 | 10 | 280 |
| 27 | 10 | 0 | 5 | 0 | 2 | 10 | 270 |
| 26 | 9 | 0 | 5 | 0 | 2 | 10 | 260 |
| 25 | 8 | 5 | 5 | 1 | 3 | 15 | 375 |
| 24 | 7 | 0 | 5 | 0 | 3 | 15 | 360 |
| 23 | 6 | 5 | 5 | 1 | 4 | 20 | 460 |
| 22 | 5 | 5 | 5 | 1 | 5 | 25 | 550 |
| 21 | 4 | 5 | 5 | 1 | 6 | 30 | 630 |
| 20 | 3 | 6 | 5 | 2 | 8 | 36 | 720 |
| 19 | 2 | 5 | 5 | 1 | 9 | 41 | 779 |
| 18 | 1 | 8 | 5 | 3 | 12 | 49 | 882 |
| 17 | 0 | 6 | 5 | 2 | 14 | 55 | 935 |
| 16 | -1 | 7 | 4 | 4 | 18 | 62 | 992 |
| 15 | -2 | 7 | 4 | 4 | 22 | 69 | 1035 |
| 14 | -3 | 10 | 4 | 6 | 28 | 79 | 1106 |
| 13 | -4 | 12 | 4 | 7 | 35 | 91 | 1183 |
| 12 | -5 | 15 | 4 | 9 | 44 | 106 | 1272 |
| 11 | -6 | 14 | 4 | 10 | 54 | 120 | 1320 |
| 10 | -7 | 19 | 4 | 14 | 68 | 139 | 1390 |
| 9 | -8 | 21 | 3 | 16 | 84 | 160 | 1440 |
| 8 | -9 | 27 | 3 | 21 | 105 | 187 | 1496 |
| 7 | -10 | 31 | 3 | 26 | 131 | 218 | 1526 |
| 6 | -11 | 37 | 3 | 31 | 162 | 255 | 1530 |
| 5 | -12 | 45 | 3 | 39 | 201 | 300 | 1500 |
| 4 | -13 | 50 | 2 | 46 | 247 | 350 | 1400 |
| 3 | -14 | 57 | 2 | 54 | 301 | 407 | 1221 |
| 2 | -15 | 57 | 1 | 57 | 358 | 464 | 928 |
| | | | | | | $E\{N_i\} = 119$ ← 51 | $E\{i \cdot N_i\} = 853.226$ ← 52 |

Fig. 5

| $i$ | $SNR_i$ | $n_i$ | $k_i$ | $d_i$ | $d_T$ | $N_i$ | $i \cdot N_i$ |
|---|---|---|---|---|---|---|---|
| 32 | 15 | 5 | 5 | 1 | 1 | 5 | 160 |
| 31 | 14 | 0 | 5 | 0 | 1 | 5 | 155 |
| 30 | 13 | 0 | 5 | 0 | 1 | 5 | 150 |
| 29 | 12 | 0 | 5 | 0 | 1 | 5 | 145 |
| 28 | 11 | 5 | 5 | 1 | 2 | 10 | 280 |
| 27 | 10 | 0 | 5 | 0 | 2 | 10 | 270 |
| 26 | 9 | 5 | 5 | 1 | 2 | 10 | 260 |
| 25 | 8 | 0 | 5 | 0 | 3 | 15 | 375 |
| 24 | 7 | 5 | 5 | 1 | 3 | 15 | 360 |
| 23 | 6 | 5 | 5 | 1 | 4 | 20 | 460 |
| 22 | 5 | 5 | 5 | 1 | 5 | 25 | 550 |
| 21 | 4 | 5 | 5 | 1 | 6 | 30 | 630 |
| 20 | 3 | 6 | 5 | 2 | 8 | 36 | 720 |
| 19 | 2 | 5 | 5 | 1 | 9 | 41 | 779 |
| 18 | 1 | 9 | 5 | 3 | 12 | 50 | 900 |
| 17 | 0 | 6 | 5 | 2 | 14 | 56 | 952 |
| 16 | -1 | 8 | 4 | 4 | 18 | 64 | 1024 |
| 15 | -2 | 8 | 4 | 4 | 22 | 72 | 1080 |
| 14 | -3 | 12 | 4 | 6 | 28 | 84 | 1176 |
| 13 | -4 | 14 | 4 | 7 | 35 | 98 | 1274 |
| 12 | -5 | 19 | 4 | 9 | 44 | 117 | 1404 |
| 11 | -6 | 20 | 4 | 10 | 54 | 137 | 1507 |
| 10 | -7 | 27 | 4 | 14 | 68 | 164 | 1640 |
| 9 | -8 | 30 | 4 | 16 | 84 | 194 | 1746 |
| 8 | -9 | 38 | 3 | 21 | 105 | 232 | 1856 |
| 7 | -10.0 | 46 | 3 | 26 | 131 | 278 | 1946 |
| 6 | -11.0 | 55 | 3 | 31 | 162 | 333 | 1998 |
| 5 | -12.0 | 69 | 3 | 39 | 201 | 402 | 2010 |
| 4 | -13.0 | 69 | 2 | 46 | 247 | 471 | 1884 |
| 3 | -14.0 | 81 | 2 | 54 | 301 | 552 | 1656 |
| 2 | -15.0 | 57 | 1 | 57 | 358 | 609 | 1218 |
| | | | | | | $E\{N_i\} = 149$ | $E\{i \cdot N_i\} = 985.968$ |

61 → $N_i = 609$
62 → $E\{i \cdot N_i\} = 985.968$

Fig. 6

| $i$ | $SNR_i$ | $n_i$ | $k_i$ | $d_L$ | $d_T$ | $N_i$ | $i \cdot N_i$ | $N_i(\beta)$ |
|---|---|---|---|---|---|---|---|---|
| 48 | 13.46 | 0 | 6 | 0 | 1 | 6 | 288 | 64 |
| 47 | 13.61 | 0 | 6 | 0 | 1 | 6 | 282 | 64 |
| 46 | 12.33 | 0 | 6 | 1 | 2 | 12 | 552 | 64 |
| 45 | 12.33 | 0 | 6 | 0 | 2 | 12 | 540 | 64 |
| 44 | 11.95 | 0 | 6 | 0 | 2 | 12 | 528 | 64 |
| 43 | 11.95 | 0 | 6 | 0 | 2 | 12 | 516 | 64 |
| 42 | 11.37 | 0 | 6 | 0 | 2 | 12 | 504 | 64 |
| 41 | 11.37 | 0 | 6 | 0 | 2 | 12 | 492 | 64 |
| 40 | 9.96 | 0 | 6 | 0 | 2 | 12 | 480 | 64 |
| 39 | 9.96 | 0 | 6 | 0 | 2 | 12 | 468 | 64 |
| 38 | 8.71 | 0 | 6 | 1 | 3 | 18 | 684 | 64 |
| 37 | 8.71 | 0 | 6 | 0 | 3 | 18 | 666 | 64 |
| 36 | 6.55 | 7 | 5 | 2 | 5 | 25 | 900 | 64 |
| 35 | 6.55 | 0 | 5 | 0 | 5 | 25 | 875 | 64 |
| 34 | 4.79 | 7 | 5 | 2 | 7 | 32 | 1088 | 96 |
| 33 | 4.79 | 0 | 5 | 0 | 7 | 32 | 1056 | 96 |
| 32 | 1.90 | 14 | 5 | 6 | 13 | 46 | 1472 | 96 |
| 31 | 1.90 | 0 | 5 | 0 | 13 | 46 | 1426 | 96 |
| 30 | 0.73 | 10 | 5 | 4 | 17 | 56 | 1680 | 96 |
| 29 | 0.73 | 0 | 5 | 0 | 17 | 56 | 1624 | 96 |
| 28 | -0.16 | 9 | 5 | 3 | 20 | 65 | 1820 | 96 |
| 27 | -0.16 | 0 | 5 | 0 | 20 | 65 | 1755 | 96 |
| 26 | -1.91 | 21 | 5 | 10 | 30 | 86 | 2236 | 128 |
| 25 | -1.91 | 0 | 5 | 0 | 30 | 86 | 2150 | 128 |
| 24 | -2.28 | 6 | 5 | 2 | 32 | 92 | 2208 | 192 |
| 23 | -3.17 | 15 | 5 | 7 | 39 | 107 | 2461 | 192 |
| 22 | -3.17 | 0 | 5 | 0 | 39 | 107 | 2354 | 192 |
| 21 | -4.93 | 40 | 5 | 20 | 59 | 147 | 3087 | 288 |
| 20 | -6.18 | 39 | 4 | 19 | 78 | 186 | 3720 | 384 |
| 19 | -6.18 | 0 | 4 | 0 | 78 | 186 | 3534 | 384 |
| 18 | -7.94 | 75 | 4 | 38 | 116 | 261 | 4698 | 576 |
| 17 | -7.94 | 0 | 4 | 0 | 116 | 261 | 4437 | 576 |
| 16 | -9.19 | 71 | 4 | 37 | 153 | 332 | 5312 | 768 |
| 15 | -9.19 | 0 | 4 | 0 | 153 | 332 | 4980 | 768 |
| 14 | -10.16 | 139 | 4 | 73 | 190 | 403 | 5642 | 960 |
| 13 | -10.16 | 0 | 4 | 0 | 190 | 403 | 5239 | 960 |
| 12 | -11.62 | 134 | 4 | 71 | 263 | 542 | 6504 | 1344 |
| 11 | -11.62 | 0 | 4 | 0 | 263 | 542 | 5962 | 1344 |
| 10 | -12.71 | 123 | 3 | 70 | 334 | 676 | 6760 | 1728 |
| 9 | -12.71 | 0 | 3 | 0 | 334 | 676 | 6084 | 1728 |
| 8 | -13.59 | 174 | 3 | 99 | 404 | 799 | 6392 | 2112 |
| 7 | -13.59 | 0 | 3 | 0 | 404 | 799 | 5593 | 2112 |
| 6 | -14.63 | 188 | 3 | 99 | 503 | 973 | 5838 | 2688 |
| 5 | -14.63 | 0 | 3 | 0 | 503 | 973 | 4865 | 2688 |
| 4 | -15.72 | 0 | 2 | 125 | 628 | 1161 | 4644 | 3456 |
| 3 | -15.72 | 0 | 2 | 0 | 628 | 1161 | 3483 | 3456 |
| 2 | -16.79 | 124 | 1 | 124 | 752 | 1284 | 2570 | 4416 |
| | | | | | | $E\{N_i\}=301$ | $E\{i \cdot N_i\}=2775.51$ | $E\{N_i(\beta)\}=750$ |

Fig. 7

| $i$ | $SNR_i$ | $n_i$ | $k_i$ | $d_i$ | $d_T$ | $N_i$ | $i \cdot N_i$ |
|---|---|---|---|---|---|---|---|
| 32 | 15 | 39 | 5 | 19 | 19 | 39 | 1248 |
| 31 | 14 | 0 | 5 | 0 | 19 | 39 | 1209 |
| 30 | 13 | 0 | 5 | 0 | 19 | 39 | 1170 |
| 29 | 12 | 0 | 5 | 0 | 19 | 39 | 1131 |
| 28 | 11 | 0 | 5 | 0 | 19 | 39 | 1092 |
| 27 | 10 | 0 | 5 | 0 | 19 | 39 | 1053 |
| 26 | 9 | 0 | 5 | 0 | 19 | 39 | 1014 |
| 25 | 8 | 0 | 5 | 0 | 19 | 39 | 975 |
| 24 | 7 | 0 | 5 | 0 | 19 | 39 | 936 |
| 23 | 6 | 0 | 5 | 0 | 19 | 39 | 897 |
| 22 | 5 | 0 | 5 | 0 | 19 | 39 | 858 |
| 21 | 4 | 0 | 5 | 0 | 19 | 39 | 819 |
| 20 | 3 | 0 | 5 | 0 | 19 | 39 | 780 |
| 19 | 2 | 0 | 5 | 0 | 19 | 39 | 741 |
| 18 | 1 | 0 | 5 | 0 | 19 | 39 | 702 |
| 17 | 0 | 0 | 5 | 0 | 19 | 39 | 663 |
| 16 | -1 | 177 | 4 | 94 | 113 | 216 | 3456 |
| 15 | -2 | 0 | 4 | 0 | 113 | 216 | 3240 |
| 14 | -3 | 0 | 4 | 0 | 113 | 216 | 3024 |
| 13 | -4 | 0 | 4 | 0 | 113 | 216 | 2808 |
| 12 | -5 | 0 | 4 | 0 | 113 | 216 | 2592 |
| 11 | -6 | 0 | 4 | 0 | 113 | 216 | 2376 |
| 10 | -7 | 0 | 4 | 0 | 113 | 216 | 2160 |
| 9 | -8 | 0 | 4 | 0 | 113 | 216 | 1944 |
| 8 | -9 | 49 | 3 | 28 | 141 | 265 | 2120 |
| 7 | -10 | 60 | 3 | 34 | 175 | 325 | 2275 |
| 6 | -11 | 168 | 3 | 96 | 271 | 493 | 2958 |
| 5 | -12 | 0 | 3 | 0 | 271 | 493 | 2465 |
| 4 | -13 | 213 | 2 | 142 | 413 | 706 | 2824 |
| 3 | -14 | 0 | 2 | 0 | 413 | 706 | 2118 |
| 2 | -15 | 85 | 1 | 85 | 498 | 791 | 1582 |
| | | | | | | $E\{N_i\} = 216$ | $E\{i \cdot N_i\} = 1717.1$ |

Fig. 8

| $i$ | $SNR_i$ | $m_i$ | $k_i$ | $d_i$ | $d_T$ | $N_i$ | $i \cdot N_i$ | $N_i(3)$ |
|---|---|---|---|---|---|---|---|---|
| 48 | 13.46 | 17 | 6 | 0 | 7 | 17 | 816 | 64 |
| 47 | 13.61 | 0 | 6 | 0 | 7 | 17 | 799 | 64 |
| 46 | 12.33 | 0 | 6 | 0 | 7 | 17 | 782 | 64 |
| 45 | 12.33 | 0 | 6 | 0 | 7 | 17 | 765 | 64 |
| 44 | 11.95 | 0 | 6 | 0 | 7 | 17 | 748 | 64 |
| 43 | 11.37 | 0 | 6 | 0 | 7 | 17 | 731 | 64 |
| 42 | 11.37 | 0 | 6 | 0 | 7 | 17 | 714 | 64 |
| 41 | 9.96 | 0 | 6 | 0 | 7 | 17 | 697 | 64 |
| 40 | 9.96 | 0 | 6 | 0 | 7 | 17 | 680 | 64 |
| 39 | 8.71 | 0 | 6 | 0 | 7 | 17 | 663 | 64 |
| 38 | 8.71 | 0 | 6 | 0 | 7 | 17 | 646 | 64 |
| 37 | 6.55 | 0 | 6 | 0 | 7 | 17 | 629 | 64 |
| 36 | 6.55 | 0 | 6 | 0 | 7 | 17 | 612 | 64 |
| 35 | 4.79 | 0 | 6 | 0 | 7 | 17 | 595 | 64 |
| 34 | 4.79 | 0 | 5 | 0 | 7 | 17 | 578 | 64 |
| 33 | 1.9 | 0 | 5 | 0 | 7 | 17 | 561 | 64 |
| 32 | 1.9 | 62 | 5 | 32 | 39 | 79 | 2528 | 96 |
| 31 | 0.73 | 0 | 5 | 0 | 39 | 79 | 2449 | 96 |
| 30 | 0.73 | 0 | 5 | 0 | 39 | 79 | 2370 | 96 |
| 29 | -0.16 | 0 | 5 | 0 | 39 | 79 | 2291 | 96 |
| 28 | -0.16 | 0 | 5 | 0 | 39 | 79 | 2212 | 96 |
| 27 | -1.91 | 0 | 5 | 0 | 39 | 79 | 2133 | 96 |
| 26 | -1.91 | 0 | 5 | 0 | 39 | 79 | 2054 | 96 |
| 25 | -2.28 | 0 | 5 | 0 | 39 | 79 | 1975 | 128 |
| 24 | -3.17 | 0 | 5 | 0 | 39 | 79 | 1896 | 128 |
| 23 | -3.17 | 0 | 5 | 0 | 39 | 79 | 1817 | 192 |
| 22 | -4.93 | 0 | 4 | 0 | 39 | 79 | 1738 | 192 |
| 21 | -4.93 | 148 | 4 | 76 | 115 | 227 | 4767 | 288 |
| 20 | -6.18 | 0 | 4 | 0 | 115 | 227 | 4540 | 384 |
| 19 | -6.18 | 0 | 4 | 0 | 115 | 227 | 4313 | 384 |
| 18 | -7.94 | 0 | 4 | 0 | 115 | 227 | 4086 | 576 |
| 17 | -7.94 | 0 | 4 | 0 | 115 | 227 | 3859 | 576 |
| 16 | -9.19 | 277 | 4 | 147 | 262 | 504 | 8064 | 768 |
| 15 | -9.19 | 0 | 4 | 0 | 262 | 504 | 7560 | 768 |
| 14 | -10.16 | 0 | 4 | 0 | 262 | 504 | 7056 | 960 |
| 13 | -10.16 | 0 | 4 | 0 | 262 | 504 | 6552 | 960 |
| 12 | -11.62 | 0 | 4 | 0 | 262 | 504 | 6048 | 1344 |
| 11 | -11.62 | 132 | 4 | 70 | 332 | 636 | 6996 | 1728 |
| 10 | -12.71 | 0 | 4 | 0 | 332 | 636 | 6360 | 2112 |
| 9 | -12.71 | 119 | 3 | 68 | 400 | 755 | 6795 | 2112 |
| 8 | -13.59 | 0 | 3 | 0 | 400 | 755 | 6040 | 2688 |
| 7 | -14.63 | 171 | 3 | 97 | 497 | 926 | 6482 | 3456 |
| 6 | -14.63 | 0 | 3 | 0 | 497 | 926 | 5556 | 3456 |
| 5 | -15.72 | 174 | 2 | 115 | 613 | 1100 | 5500 | 4416 |
| 4 | -15.72 | 0 | 2 | 0 | 613 | 1100 | 4400 | |
| 3 | -16.79 | 139 | 1 | 139 | 752 | 1239 | 3717 | |
| | | | | | | $E\{N_i\}=285$ ← 91 | $E\{i\cdot N_i\}=2902.36$ ← 92 | $E\{N_i(3)\}=750$ |

Fig. 9

| $j$ | $N_j$ | $c_j$ |
|---|---|---|
| 0 | 39 | 111100000001110100101011001011010101001 |
| 1 | 39 | 011010011001011111100000011000011111100 |
| 2 | 39 | 101001010101101011010100101100101011010 |
| 3 | 39 | 001111001100001001111110000110000001111 |
| 4 | 39 | 110000110011101001100110010110011001110 |
| 5 | 39 | 010110101010010110011001100001100110011 |
| 6 | 39 | 100101100101000101010101010101010010101 |
| 7 | 39 | 000011111111000000000111111111111000000 |
| 8 | 39 | 111111110000000101001101001010110010110 |
| 9 | 39 | 011001101001100111100111100000011000011 |
| 10 | 39 | 101010100101010010100110101001011001011 |
| 11 | 39 | 001100111100110001111001111110000110000 |
| 12 | 39 | 110011000011001100110100110011001011001 |
| 13 | 39 | 010101011010101110011100110011001100 |
| 14 | 39 | 100110010110010101010101011010101010 |
| 15 | 39 | 000000011111110000000000011111111111 |
| 16 | 216 | 1111000011110001010010101101010010101 10 1010010101101101010011001010110111100110000111100001100111100110100110010110111100110000111110000110011110100110010101101011101101001100010010 |
| 17 | 216 | 0110100101101001111000000011111110000001111110000001101110011000110011111111100001110000000011110111100100001100111111110000110110000000011110111100100001100111111110000011110111100100001101111001100111 |
| 18 | 216 | 1010010101001001101010010101011010100101 01101010010110110101010010101110011110011001100100000110011101010101001011100111100110011001100001100111101010101001011100111100100110010011001100100001001 |
| 19 | 216 | 001111000011110001111100000011111100000011111110000000011111110000000000111111111000000000000011111111100000000000011111111111111110000000000111111111110000000000011111110000000001111111110000 |
| 20 | 216 | 11000011100000110011001100110011001100110011001100110100110011110000110011001000011110000011100110100100111110000011100110000111100001110011010011001111100001110011010011001111001101001100110011 |
| 21 | 216 | 010110100101101110011001100110011001100110110010001001111001100001111000011111110000111100000110011110001110000110011001100000111100000111001010011011001100111111000001110010000111100001111111001100 |
| 22 | 216 | 100101101001010110101011010100101011010100 0101011010101010101010110011001100110011001100110010101101010101010110011001100111100110011010101001010101010101011001100110011111001100110011001100111100110011001 111001100110011001100110011010010101010101010110011001100100110011001100110011010011 |
| 23 | 216 | 000011110000110000001111110000001111111 0000001111111000000001111111100000000000001111111111111100000001111111100000000000011 11111111110000000011111111000000000000001111111111111111100000000111111110000000011111111 |
| 24 | 265 | 1111111111111101001101001101001101001 101001101001110101010100111100110000100111100110000111101001011010001111001100001100 111100110000111010010110100111110011000011001111001100001111010001010010011101001011010011 11010010110100111010011110011111001100001 |
| 25 | 325 | 01100110011001111110011110011110011100 111100111100011110001111000011111110000000011111110000011110001111000011111110000000 00111111110000011110001111000011111110000000111111100000011110001111000011110001111100 011110001110001111000111100011111110000 011111100000111100011110001111000111100011110001111100011111110000 |
| 26 | 493 | 10101010101010101101001101001101001101 0 01010011010101010010110101001110011000011001110011001011010010101010011110011000 110011110011001010100101010110011100110000110011110011001011010010110101010101001011010 011010101010101010110101010110101100011100110 10101101010101010101101010101010101100100110101100111101100 10110101010101010101010110101010011110011001011010101010101010101101001 1110011001010101010101010101101010110010110011100110010110101100111100110 0 |

Fig. 11a

| $j$ | $N_j$ | $c_j$ |
|---|---|---|
| 27 | 493 | 00110011001100100111100111100111100111<br>001111001111000111100000111100000011111111100000000011111111000111100001111000000111111100-<br>00000011111110001111000011110000001111111100000000111111100011110000111100001111<br>00011110001110001110001110001110000001111111<br>00000111111000111100011110001111000111100011100000011111111<br>00011110001110001110001110001110000001111111000111100011110001110000111100011110000-<br>00111111110001111000111100011110001110000001111111000111100000011111111 |
| 28 | 706 | 1100110011001101001101001101001101001101<br>10011010011011001100110011011110000111100001110000111100110011001100110111100001110000-<br>111100001110011001100110011011110000111100001110000011110011001100110011011001100110<br>110011011001101100110110011011001101111000011100<br>110100110101100110110011011001101100110110011011110000111100<br>110011011001101100110110011011001101111000011100110011011001101100110110011011001101111-<br>000011110011001101100110110011011001101100110111100001111001100110111100001110<br>1111111111111111111111111111111111111111111111111111111111111111111111111111111-<br>11111111111111111111111111111111111111111111111111000000000000000000000000000000000-<br>000000000000000000000000000000000 |
| 29 | 706 | 010101010101011001110011110011110011<br>110011110011011001100110011001111000011110000111100001110110011001100110011110000111100-<br>001111000011110110011001100110011110000111100001110000111011001100110011011001100110011<br>0110011011001101100110110011011001100111100001111<br>011100111101100110110011011001101100110110011001111000011111<br>0110011011001101100110110011011001100111100001110110011011001101100110110011011001100111-<br>11000011110110011011001101100110110011011001101100110011110000111011001100111100001111<br>11111111111111111111111111111111111111111111111111111111111110000000000000000000-<br>00000000000000000000000000000000000000000000000000011111111111111111111111111111-<br>1111111111111111111111111111111111 |
| 30 | 791 | 100110011001100101010101010101010101<br>0101010101011010101010101110011001100110011001100110011010101010101011001100110011001100-<br>1100110011001110101010101011100110011001100110011001100110011010101010101011010101010101<br>101010110101011010101101010110101011100110011<br>10101010101101010110101011010101101010111001100110011<br>1010101101010110101011010101101010111001100110011010101101010101010101010110101011100-<br>11001100111010101101010110101011010101110011001100111010101110011001100110011<br>0000000000000000000000000000000000000000000000000000000000000000000000111111111111111-<br>1111111111111111111111111111111111111111111111111111111111111111111111111111111-<br>11111111111111111111111111111111<br>11111111111111111111111111111111111111111111111111111111111111111111111111111111 |

Fig. 11b

| SNR | k=1 | k=2 | k=3 | k=4 | k=5 | k=6 | k=7 | k=8 | k=9 |
|---|---|---|---|---|---|---|---|---|---|
| -20.0 | 1130 | 1854 | 2608 | 2776 | 2928 | 3072 | 3200 | 3456 | 3584 |
| -19.0 | 898 | 1473 | 2072 | 2200 | 2320 | 2432 | 2560 | 2688 | 2816 |
| -18.0 | 713 | 1170 | 1644 | 1752 | 1840 | 1952 | 2048 | 2176 | 2304 |
| -17.0 | 567 | 930 | 1308 | 1392 | 1472 | 1536 | 1664 | 1792 | 1792 |
| -16.0 | 450 | 738 | 1040 | 1104 | 1168 | 1248 | 1280 | 1408 | 1536 |
| -15.0 | 358 | 588 | 824 | 880 | 928 | 992 | 1024 | 1152 | 1280 |
| -14.0 | 284 | 468 | 656 | 696 | 736 | 768 | 832 | 896 | 1024 |
| -13.0 | 226 | 372 | 520 | 560 | 592 | 640 | 640 | 768 | 768 |
| -12.0 | 180 | 294 | 416 | 440 | 464 | 512 | 512 | 640 | 768 |
| -11.0 | 143 | 234 | 328 | 352 | 368 | 416 | 448 | 512 | 512 |
| -10.0 | 113 | 186 | 264 | 280 | 304 | 320 | 320 | 384 | 512 |
| -9.0 | 90 | 150 | 208 | 224 | 240 | 256 | 256 | 384 | 256 |
| -8.0 | 72 | 117 | 168 | 176 | 192 | 224 | 256 | 256 | 256 |
| -7.0 | 57 | 93 | 132 | 144 | 160 | 160 | 192 | 256 | 256 |
| -6.0 | 45 | 75 | 104 | 112 | 128 | 128 | 128 | 256 | 256 |
| -5.0 | 36 | 60 | 84 | 88 | 96 | 128 | 128 | 128 | 256 |
| -4.0 | 29 | 48 | 68 | 72 | 80 | 96 | 128 | 128 | 256 |
| -3.0 | 23 | 39 | 52 | 56 | 64 | 64 | 64 | 128 | 256 |
| -2.0 | 18 | 30 | 44 | 48 | 48 | 64 | 64 | 128 | 256 |
| -1.0 | 15 | 24 | 36 | 40 | 48 | 64 | 64 | 128 | 256 |

Fig. 13

| SNR | $k=1$ | $k=2$ | $k=3$ | $k=4$ | $k=5$ | $k=6$ | $k=7$ | $k=8$ | $k=9$ |
|---|---|---|---|---|---|---|---|---|---|
| -20.0 | 1575 | 2523 | 3500 | 3664 | 3824 | 3968 | 4096 | 4352 | 4608 |
| -19.0 | 1251 | 2004 | 2780 | 2912 | 3040 | 3168 | 3264 | 3456 | 3584 |
| -18.0 | 994 | 1593 | 2208 | 2312 | 2416 | 2496 | 2624 | 2688 | 2816 |
| -17.0 | 790 | 1266 | 1756 | 1840 | 1920 | 1984 | 2112 | 2176 | 2304 |
| -16.0 | 627 | 1005 | 1396 | 1464 | 1520 | 1600 | 1664 | 1792 | 1792 |
| -15.0 | 498 | 798 | 1108 | 1160 | 1216 | 1280 | 1344 | 1408 | 1536 |
| -14.0 | 396 | 636 | 880 | 928 | 960 | 1024 | 1088 | 1152 | 1280 |
| -13.0 | 315 | 504 | 700 | 736 | 768 | 800 | 832 | 896 | 1024 |
| -12.0 | 250 | 402 | 556 | 584 | 608 | 640 | 704 | 768 | 768 |
| -11.0 | 199 | 318 | 444 | 464 | 480 | 512 | 576 | 640 | 768 |
| -10.0 | 158 | 255 | 352 | 368 | 384 | 416 | 448 | 512 | 512 |
| -9.0 | 126 | 201 | 280 | 296 | 304 | 320 | 384 | 384 | 512 |
| -8.0 | 100 | 162 | 224 | 232 | 256 | 256 | 320 | 384 | 512 |
| -7.0 | 79 | 129 | 176 | 184 | 192 | 224 | 256 | 256 | 256 |
| -6.0 | 63 | 102 | 140 | 152 | 160 | 160 | 192 | 256 | 256 |
| -5.0 | 50 | 81 | 112 | 120 | 128 | 128 | 192 | 256 | 256 |
| -4.0 | 40 | 66 | 88 | 96 | 96 | 128 | 128 | 128 | 256 |
| -3.0 | 32 | 51 | 72 | 80 | 80 | 96 | 128 | 128 | 256 |
| -2.0 | 25 | 42 | 56 | 64 | 64 | 64 | 128 | 128 | 256 |
| -1.0 | 20 | 33 | 48 | 48 | 48 | 64 | 64 | 128 | 256 |

METHOD AND SYSTEM FOR GENERATING CHANNEL CODES, IN PARTICULAR FOR A FRAME-HEADER

FIELD OF THE INVENTION

The present invention relates to a method and a system for generating channel codes, in particular channel codes for a frame-header in an ACM ("Adaptive Coding and Modulation") communication system.

DESCRIPTION OF THE PRIOR ART

Real-time adaptation of transmission parameters according to the channel conditions is highly desirable feature in the communication systems where the channel parameters may change in time or from one receiver to another.

Time and/or user varying channel condition is an important characteristic of most communication systems such as satellite, network and broadcast systems.

According to the prior art, adaptive coding and modulation schemes have been proposed in such systems to provide significant capacity gains by real-time adaptation of the FEC ("Forward Error Correction") code rate/length and modulation constellation.

The main idea of an ACM scheme is to increase the capacity of a system communication by avoiding the waste of resources caused by adopting a fixed physical layer scenario by which the spectral efficiency must be sacrificed to guarantee a good performance for the user with the worst channel conditions.

By employing an ACM scheme, the transmitter is able to switch between several constellations and codes choosing the largest available modulation and code rate which ensures a target DER ("Detection Error Rate"), therefore insuring maximum spectral efficiency for each user. At the receiver, to successfully decode the message, each user should be able to decide whether the message is intended to him and/or to recognize the parameters of the constellation and code which has been used by the transmitter.

In general, each packet sent by the transmitter consists of two main parts.

The first part is called frame-header, or simply header, and contains the informations regarding the modulation and coding, hereinafter called ACMI ("Adaptive Coding and Modulation Indicator").

The second part contains the message which is encoded using the corresponding ACMI parameters.

Therefore each user should first decode the information in the frame-header in order to be able to decode the rest of the message.

In applications such as satellite broadcasting, the coding strategy is not trivial due to the wide dynamic range of the SNR ("Signal to Noise Ratio"), typically from −15 dB to 15 dB. Only the use of an ACM scheme may not be sufficient to ensure the radio link, a good spectral efficiency and a target probability of error to the receiver.

It is therefore important to improve the spectral efficiency through a generation of a code which allows to minimize the average and maximum length of a frame-header.

In the patent application no. US 2010/0128661, the code generation procedure is based on heuristic considerations without any attempt to minimize the frame-header length. The variable length code consists in the repetition of a single strong Reed-Muller code to cope with the different signal to noise ratio conditions.

However, such patent application does not teach to minimize a length of a frame-header. It is the main object of the present invention to indicate a method and a system for generating channel codes, in particular for a frame header, able to minimize an average and a maximal length of a frame-header of a data packet.

It is a further object of the present invention to indicate a method and a system for generating channel codes, in particular for a frame header, able to maximize the spectral efficiency of a communication system.

It is a further object of the present invention to indicate a method and a system for generating channel codes, in particular for a frame header, able to improve the correction capability of the generated channel code.

It is a further object of the present invention to indicate a method and a system for generating channel codes, in particular for a frame header, able to decrease the computational complexity of a decoder.

It is a further object of the present invention to indicate a method and a system for generating channel codes, in particular for a frame header, able to obtain a fixed length for all code-words in order to have a same complexity of the maximum likelihood decoder of a variable length code.

These and other objects of the invention are achieved by a method and a system for generating channel codes, in particular for a frame header, as claimed in the appended claims, which are intended to be an integral part of the present description.

SUMMARY OF THE INVENTION

In short, it is disclosed a method for generating a channel code, in particular for a frame-header, wherein at least a code-word of said channel code is obtained by means of at least a concatenation of code-words of two constituent codes and such concatenation is performed on subsets of code-words of a first constituent code, having maximum length, with code-words of a second constituent code.

The users are divided, for example, into a smaller set of M types according to their radio link quality. Each user type i is associated with an available signal to noise ratio $SNR_i$. It is assumed that for any two user types k and m, if k>m, then $SNR_k$>$SNR_m$.

A set of maximum ACM modes, $ACM_i$, are associated to the set of user types. Each user type i must be capable of detecting and decoding all packets encoded with ACM modes j≤i, corresponding to signal to noise ratio SNR lower or equal to that associated to the user type i. Consequently, users of higher types, corresponding to high SNR values, must then be able to detect the ACM mode within a larger set than that of users of lower type.

This corresponds to the generation of a code which admits a sequence of subsets of code-words of such code with very large differences in the correction capabilities.

Further features of the invention are set out in the appended claims, which are intended to be an integral part of the present description.

BRIEF DESCRIPTION OF THE DRAWINGS

The above objects will become more apparent from the following detailed description of a method for generating channel codes, with particular reference to the annexed drawings, wherein:

FIG. 5 shows parameters of codes for a variable length code with thirty-two modes using the method according to the present invention and the Hamming code bound with DER ("Detection Error Rate") equal to $10^{-6}$;

FIG. 6 shows parameters of codes for a variable length code with thirty-two modes using linear codes of the prior art with DER equal to $10^{-6}$;

FIG. 7 shows parameters of codes for a variable length code with forty-eight modes using linear optimal codes of the prior art with DER equal to $10^{-8}$;

FIGS. 8 and 9 show parameters of codes for a variable length code using the method according to the present invention and linear optimal codes of the prior art with DER equal to $10^{-8}$ with respectively thirty-two and forty-eight modes;

FIGS. 11*a* e 11*b* show code-words of the code of FIG. 8;

FIGS. 12 and 13 show respectively required header packet length versus minimal signal to noise ratio SNR for some values of k bits when DER is fixed to $10^{-6}$ and data relating to FIG. 12, thus corresponding to a straightforward worst case design of frame-header;

FIGS. 14 and 15 show respectively required header packet length versus minimal signal to noise ratio SNR for some values of k bits when DER is fixed to $10^{-8}$ and data relating to FIG. 14, thus corresponding to a straightforward worst case design of frame-header.

DETAILED DESCRIPTION OF THE PREFERRED EMBODIMENTS

Figure 1:
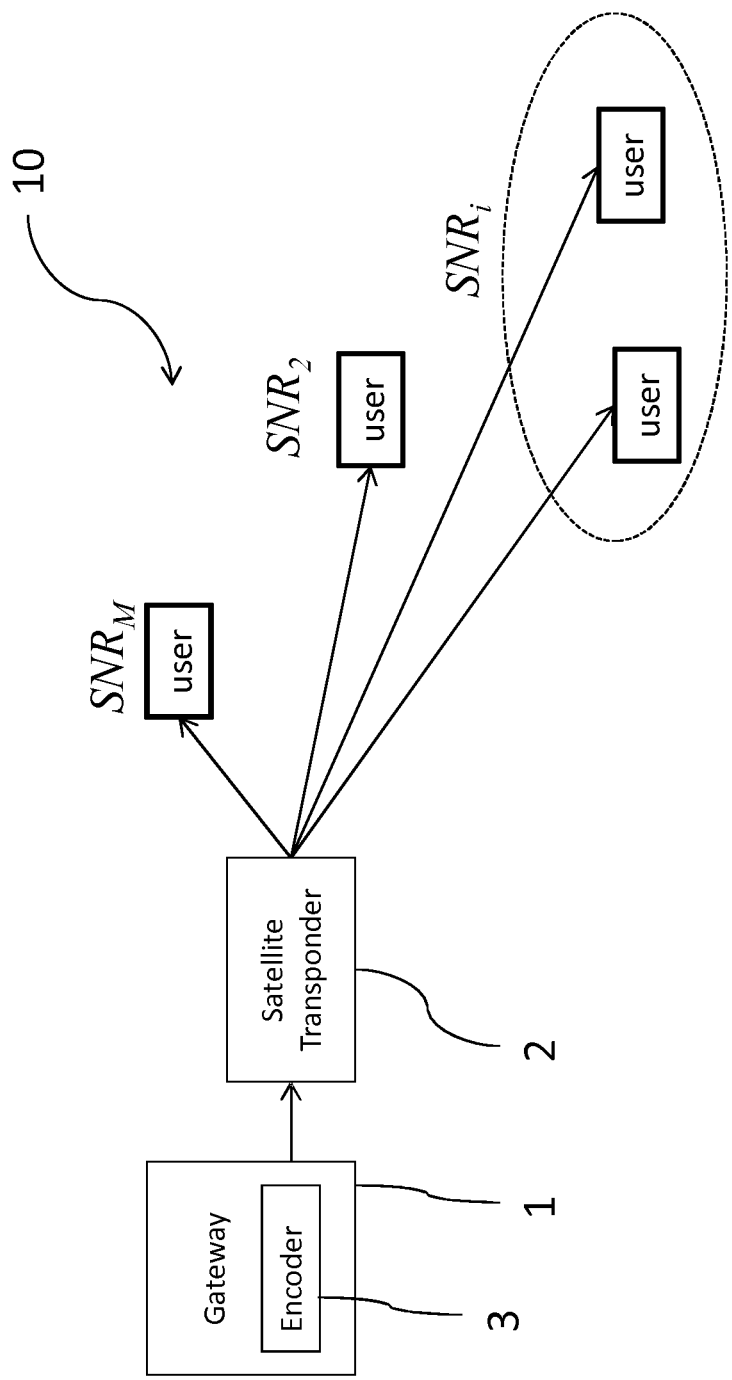
FIG. 1 shows a block diagram of a communication system.

With reference to FIG. 1, it is shown a communication system 10 used as an example of system scenario to explain the detailed description of the present invention. A plurality of users is served by a gateway 1 through a satellite transponder 2 and the gateway 1 comprises at least one encoder 3 that generate at least a code.

The users are divided into M types, for example M≤64, according to their current radio link quality and this subdivision is created by a designer during the design of the communication system 10.

Each user type i is associated with an available signal to noise ratio $SNR_i$ and it is assumed, with no loss of generality, that $SNR_i \le SNR_{i+1} \le \ldots \le SNR_M$. This latter condition is typical of satellite communication systems. Thus, signal to noise ratio is different for each user type i. Furthermore, each user type i comprises at least one physical user.

A set of maximum ACM modes are associated to each user type i. Each user type i must be capable of detecting and decoding all packets encoded with modes $ACM_j$ with j≤i. A feedback channel, not represented in FIG. 1, allows the gateway 1 to know the type i of each user.

Furthermore, the gateway 1 has the possibility of choosing for each user type i an ACM mode with index j≤i. Choosing a value below the maximum allowed i, which in principle is suboptimal for the total system capacity, allows some flexibility at the gateway 1. This additional system flexibility, however, requires that user type i detects and decodes all modes $ACM_j$ with j≤i. This requirement then imposes a high detection complexity especially to users associated to high SNR values. In particular, users with the highest user type M must detect and decode all packets from a satellite. The filtering of the packets, according to the true intended destination, is deferred after the decoding process.

Figure 2:
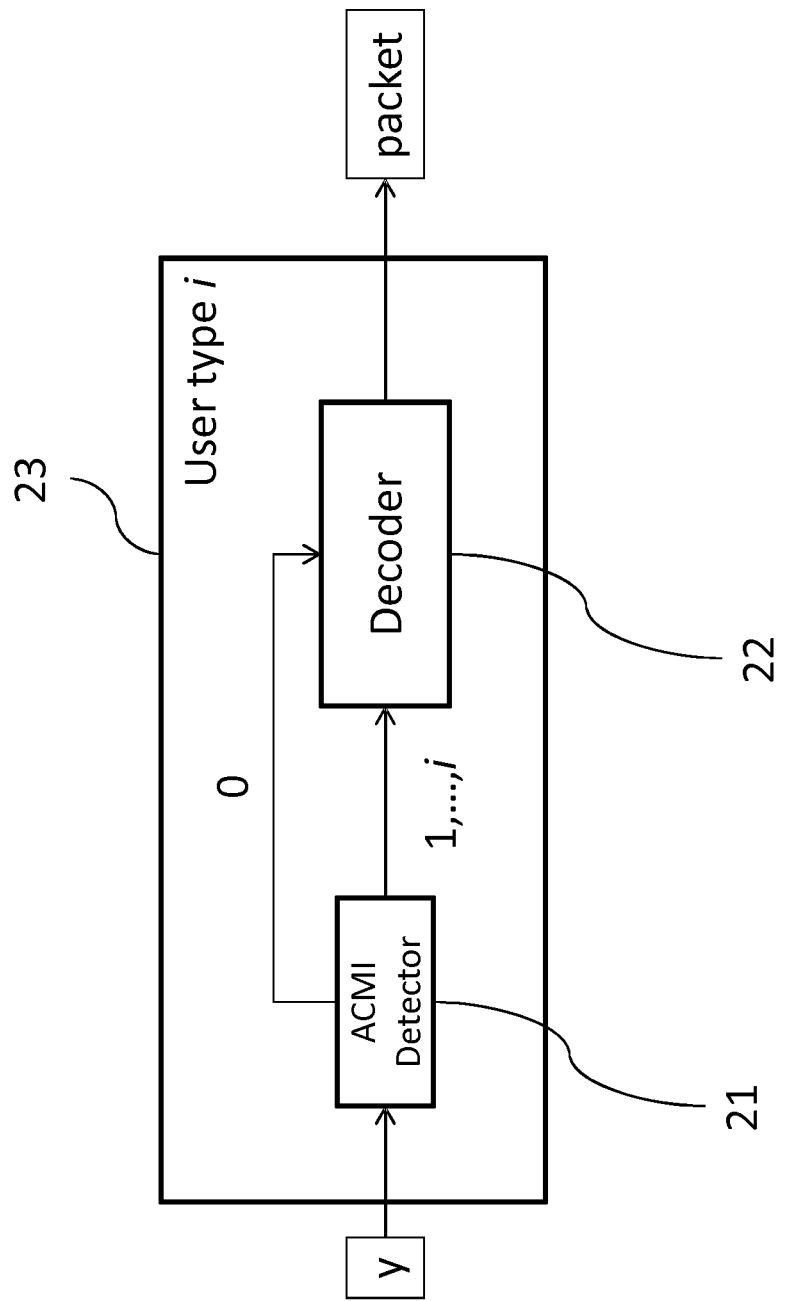
FIGS. 2 and 3 show modes of operation of an ACMI detector for a user type i.

With reference to FIG. 2, it is shown a mode of operation of a receiver 23 comprising an ACMI detector 21 for a user type i, and an input signal y, in the communication system 10 described in FIG. 1. The ACMI detector 21 delivers an index ĵ in the range [1, . . . , i] denoting an estimation of an ACM index in the allowed range, or the conventional symbol "0" to denote a failure in the detection, freezing a following decoder 22.

In this example of communication system 10, the following types of events for an ACMI are:

Detection error: $P_E = P(\hat{j} \ne j | j \le i)$

This refers to the probability that $ACMI_{\hat{j}}$, estimated from the ACMI detector 21, is transmitted to the decoder 22 from the ACMI detector 21 and it is not equal to the $ACMI_j$ received from gateway 1, given that index j is less or equal to the index i of the user type. A packet that is potentially intended to the user type i is decoded with an uncorrect ACM mode and consequently not correctly delivered.

Useless decoding: $P_U = P(\hat{j} \ne 0 | j > i)$

This refers to the probability that $ACMI_{\hat{j}}$, estimated from ACMI detector 21, is transmitted to the decoder 22 from the ACMI detector 21 and it is not equal to zero, given that index j is greater than the index i of the user type. A packet that is not intended to users of type j is incorrectly decoded with the wrong format. The only cost is a useless decoding.

From that aforementioned, it is important to design and generate codes for minimizing the probability of the detection error $P_E$, given that the cost of useless decoding $P_U$ is marginal.

Figure 3:
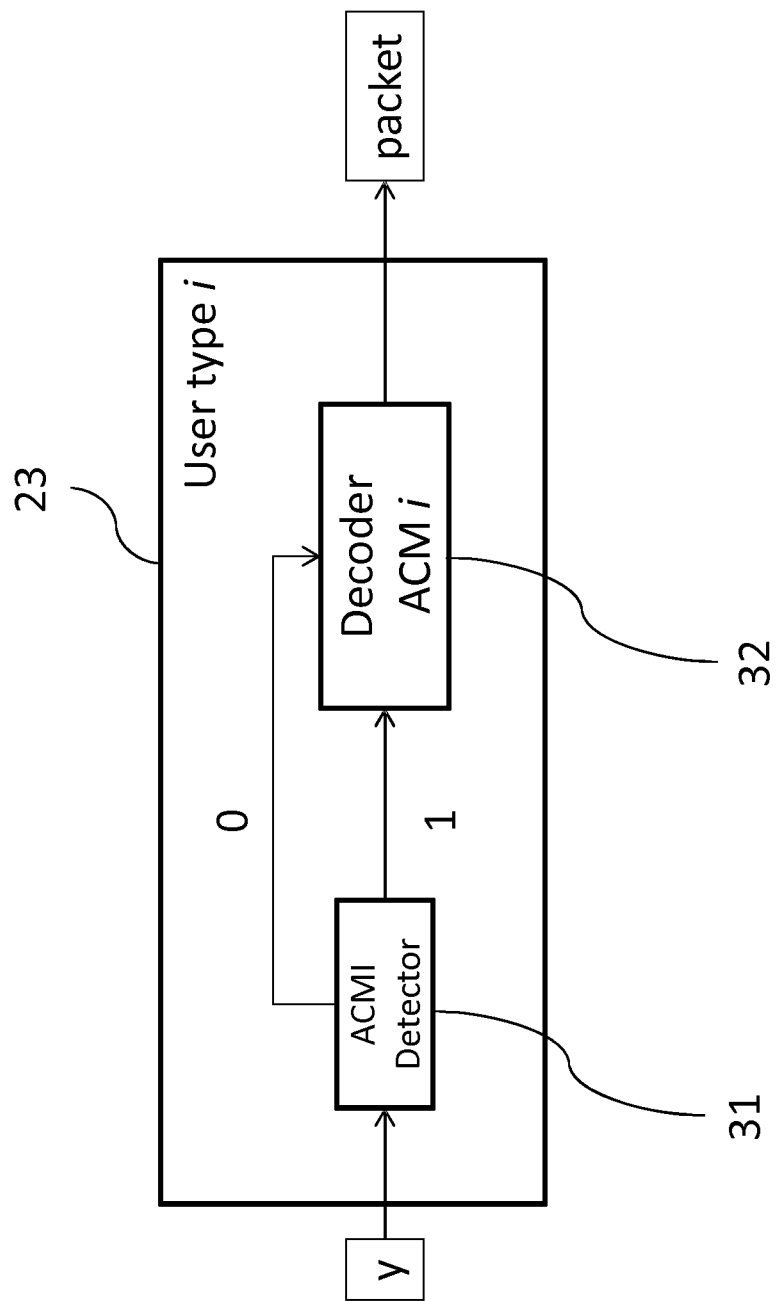

With reference to FIG. 3, it is worthwhile to notice that by removing the flexibility for the gateway 1 of choosing a mode j≤i, and thus imposing j=i at the gateway 1, the only function of an ACMI detector 31 is to activate or to freeze a following decoder 32.

An error of the ACMI detector 31 would only cause a useless decoding event. The number of useless decoding in this case can be drastically reduced also for users with good link quality.

In a first example of the present invention it is described a method for generating a channel code for minimizing the aforementioned detection error probability $P_E$, at which is associated a DER ("Detection Error Rate") of ϵ value, and with variable length code-words.

Figure 4:
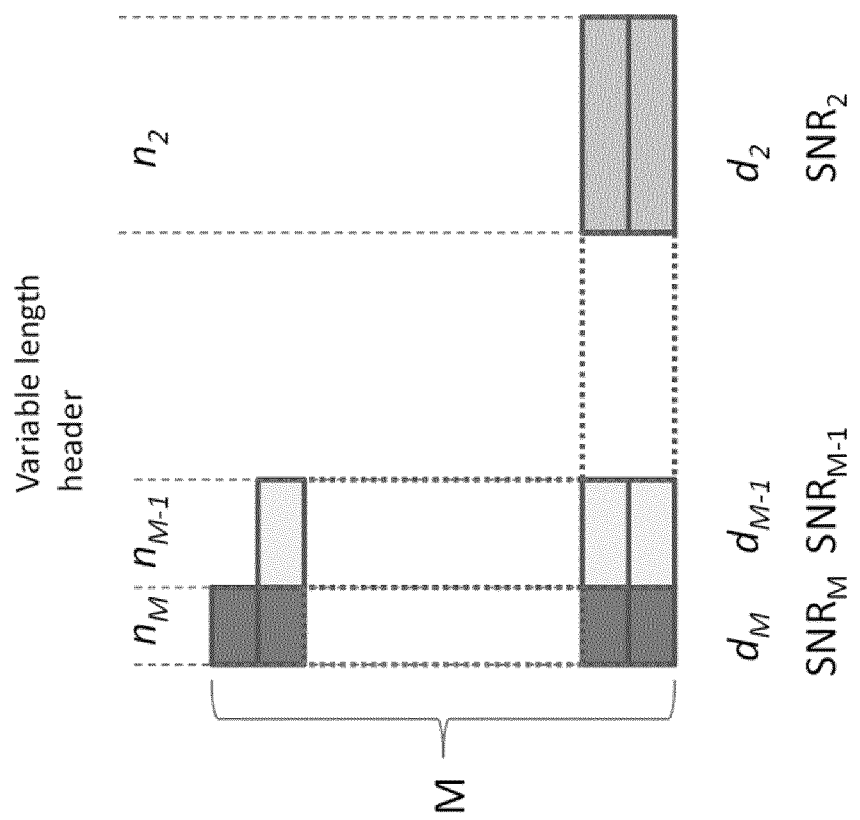
FIG. 4 shows an example of the code generation using a variable length coding.

The set of code-words is generated with variable lengths according to the following algorithm, which is shown in FIG. 4:

1. Fixing a set of M ordered SNR values $SNR_i$ corresponding to the desired modes thresholds and a desired DER ϵ;
2. Setting a total distance $d_T = 0$;
3. For all i decreasing from M to 2;
4. Computing the required incremental distance to achieve the desired DER ϵ at target $SNR_i$ $$d_i = d_{min}(\epsilon, SNR_i, i) - d_T \quad (1)$$

The minimum distance $d_{min}$ or $d_i$ depends on a signal to noise ratio SNR and on a detection error rate with ϵ value. Furthermore, the minimum distance $d_i$ increases for each generated subset of code and it is computed for each user type i.

5. If $d_i = 0$ repeat from step 3.
6. else generating a code with code-words having minimized length $n_i$, i code-words and minimum distance $d_i$
7. Setting the total distance $d_T = d_T + d_i$
8. Repeat from step 3.

9. The set of variable length code-words is finally obtained by concatenating a code-word from each of the constituent codes (see FIG. 4). The code-word of the mode i is then obtained by concatenating code-words of constituent codes from M down to i and have total length $N_i$ as follows:

$$N_i = \sum_{m=1}^{M} n_m \qquad (2)$$

With reference to FIG. 4, at least a code-word of constituent codes is encapsulated into a code-word of the channel code and at least a code-word of the channel code has length greater than remaining code-words of such channel code. Furthermore, the concatenation is performed on subsets of code-words of a first constituent code, having maximum length, with code-words of a second constituent code.

In the formula (1) it is defined the following function:

$$d_{min}(\epsilon, SNR, M) = \frac{Q^{-1}(\epsilon/(M-1))^2}{2 \cdot SNR} \qquad (3)$$

where Q is the Q-function, i.e. the complementary cumulative distribution function of the random variable standards.

The formula (3) provides the required minimum distance $d_{min}$ for a channel code with M code-words achieving a detection error rate $\epsilon$ at the signal to noise ratio SNR. This formula (3) is obtained by using the upper bound:

$$\epsilon \leq (M-1)Q\sqrt{2d_{min} \cdot SNR} \qquad (4)$$

which is rather accurate for small M and almost perfect codes.

In order to have a lower bound on what can be achieved is used, for example, the Hamming bound $$M \leq \frac{2^n}{\sum_{i=0}^{t} \binom{n}{i}} \qquad (5)$$

$$t = \left\lfloor \frac{d_{min} - 1}{2} \right\rfloor \qquad (6)$$

where t is the maximum weight of error vectors that are surely correct from the minimum distance decoding, to find the minimal length n of a code with M code-words and minimum distance $d_{min}$ required in step 6 of the previous algorithm.

With reference to FIG. 5, it is shown a result of a channel code generation using the previous algorithm for a system with 32 modes, signal to noise ratio SNR ranging from +15 to −16 dB in steps of 1 dB, for a target DER $\epsilon$=10$^{-6}$.

The columns of the table of FIG. 5 indicate, from left to right, the number of code-words i, that is also the index of the user type, the corresponding signal to noise ratio $SNR_i$, the incremental length of code-word $n_i$ of an header with index i, the number of bits $k_i$ of code-word of an header at index i, the incremental minimum distance of code-word $d_i$ of an header at index i, the total minimum distance $d_T$ i.e. the sum, at index i, of preceding $d_i$, the total code-word length $N_i$ of an header i.e. the sum, at index i, of preceding $n_i$ and, in the last column, $i \cdot N_i$ that indicate the complexity of the decoding.

It is to be noted that in this case the maximal code-word length $N_i$ is 464 symbols, indicated with the reference 51, and the average header length $E\{N_i\}$, assuming that all modes have the same probability, is only 119 symbols, indicated with the reference 52. Hamming bound is an upper bound to the number of code-words and there are few codes that achieve it.

With reference to FIG. 6, it is reported a result of a channel code generation using optimal constituent linear codes noted in the prior art, taken from the tables found on M. Grassl, "Bounds on the minimum distance of linear codes and quantum codes", available online at http://www.codetables.de, published in 2007.

These constituent linear codes, noted in the prior art, have the additional constraint of having a number of code-words that is a power of two, i.e. $2^k$, wherein k is the number of information bits. The use of these linear codes requires a maximal code-word length of 609 symbols, indicated with the reference 61, and an average header length $E\{N_i\}$ of only 149 symbols, indicated with the reference 62.

By comparing FIG. 5 and FIG. 6, it is therefore clear that the channel code, generated using the previous algorithm according to the present invention, is able to minimize the average and the maximal length of a frame-header of a data packet.

With reference to FIG. 7, it is compared an example of the generated code length according to the present invention for 48 modes with the required header length for the signaling scheme specified in D. Becker, N. Velayudhan, A. Loh, J. O'Neill, and V. Padmanabhan, "Efficient control signaling over shared communication channels with wide dynamic range", described in the U.S. patent application Ser. No. 12/621,203. The DER is fixed into $\epsilon$=10$^{-8}$.

It can be noticed that the channel code generation proposed according to the present invention allows to reduce considerably the header length for all modes. The average of header length $E\{N_i\}$ according to the U.S. patent application Ser. No. 12/621,203 is 750 (reference 71), while the average of the header length $E\{N_i\}$ (reference 72) is reduced to 301 according to this example of the present invention; in the same way the maximum header length is reduced from 4416 (reference 73) to 1285 (reference 74).

Therefore, using the method according to the present invention, by evaluating the average length $E\{N_i\}$, an improvement of about 60% is obtained.

The aforementioned algorithm, when applied to constituent linear codes, shows some weaknesses in the channel code length. This is mainly due to the fact that the number of code-words of a constituent linear code is always a power of 2.

In this case, for example, all modes from 32 to 17 in FIG. 6 share the same size. In such cases, it is useful to generate a single constituent code which guarantees a good minimum distance instead of using a completely incremental approach as described above.

It is therefore proposed an example of modified code generation algorithm as follows:
1. Fixing a set of M ordered SNR values $SNR_i$ corresponding to the desired modes thresholds and a desired DER $\epsilon$.
2. Setting $d_{T,M+1}$=0 and $N_{T,M+1}$=0.
3. For all i decreasing from M to 2
4. Setting $k = \lceil \log_2 i \rceil$
5. Computing the required minimum distance $$d_{T,i} = d_{min}(\epsilon, SNR_i, i)$$

6. For all i<j<$2^k$ (modes with the same code dimension)
7. Computing the incremental distance $$\delta_{i,j} = d_{T,i} - d_{T,j}$$

8. Generating a ($n_{i,j}$, k, $\delta_{i,j}$) linear code with minimal length $n_{i,j}$.

Notice that when the distance increment $\delta_{i,j}$ is zero, the code has length 0. In this case, k is the number of information bits and not the number of code-words.
9. Repeat from 6.
10. Picking from the previous set of codes the one with the minimal total length corresponding to j*=arg $\min_j n_{i,j} + N_{T,j}$
11. Setting $N_{T,j} = n_{T,j^*}$ and $d_{T,j} = d_{T,i}$, for all i≤j≤j*
12. Repeat from 3.
13. The set of variable length code-words is finally obtained by concatenating code-words from each of the constituent codes (see FIG. 4).

It can be noticed that, in this example, at each step are considered all the possible constituent codes with the same dimension k guaranteeing the minimum distance $d_{T,i}$. This generation allows at steps i of the iteration to change the codes generated in previous steps j≥i, provided that j<$2^{\lceil \log_2 i \rceil}$.

With reference again to the case of FIG. 4, at least a code-word of constituent codes is encapsulated into a code-word of the channel code and at least a code-word of the channel code has length greater than remaining code-words of such channel code. Furthermore, the concatenation is performed on subsets of code-words of a first constituent code, having maximum length, with code-words of a second constituent code.

The result of this new generation of codes are reported in FIG. 8 and FIG. 9 and the latter is compared with FIG. 7. It is important to notice that this new generation of codes allows to slightly reduce both the average and the maximum length of header.

In fact, the maximum length of header of FIG. 9 is 1239 symbols, indicated with the reference 91, which is lower than the maximum length of 1285 symbols of the header of FIG. 7, indicated with the reference 74; while the average length of header E{$N_i$} is reduced from 301 symbols, indicated with the reference 72, to 285 symbols, indicated with the reference 92.

Furthermore, it should be noticed that the number of generated codes is reduced. An example of generated code is represented in FIG. 10 and in FIG. 11a and in FIG. 11b are shown relative code-words.

Figure 10:
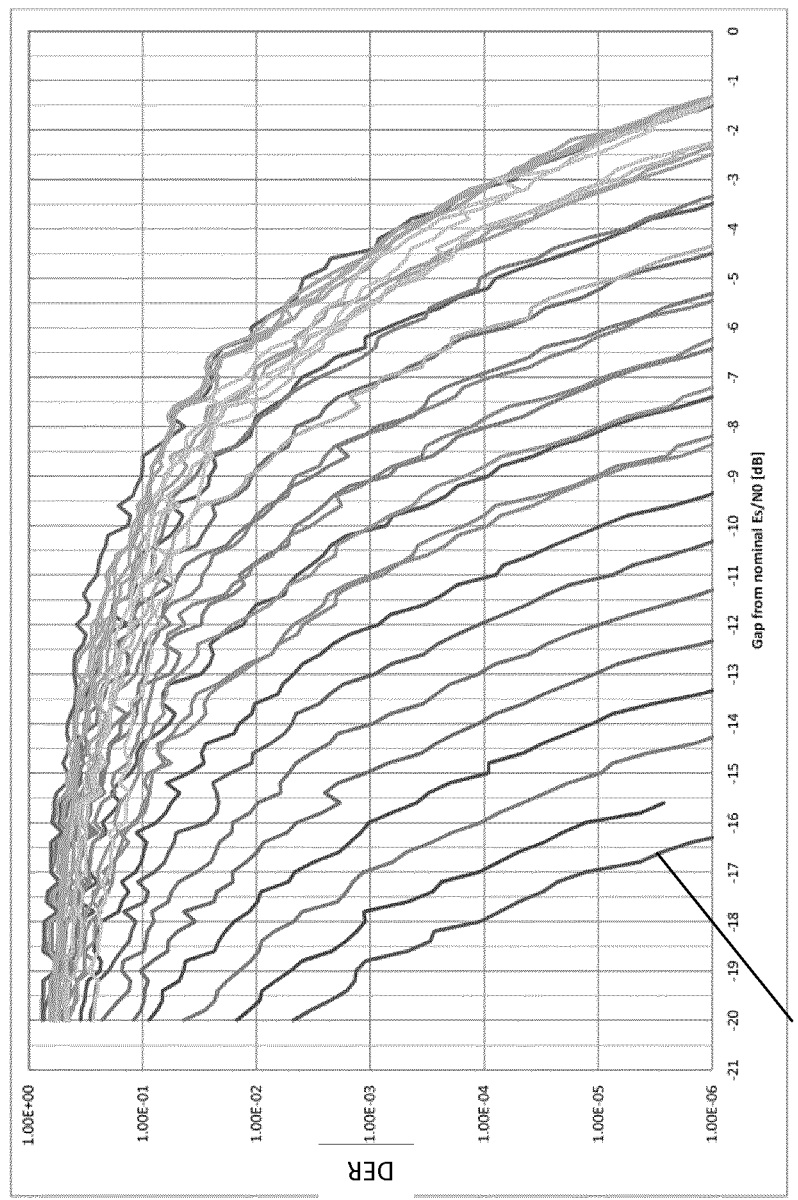
FIG. 10 shows a graph relating to data of FIG. 8.

With reference to FIG. 10, there are reported the simulation results relative to FIG. 8. The abscissa of FIG. 10 indicates the gap in dB from the nominal $SNR_i$ of each user type i. In this case many codes actually achieve the target DER with a very large margin.

For example, the curve of user type 32, indicated in the FIG. 10 with the reference number 101, achieves the target DER $\epsilon = 10^{-6}$ with a margin of about 16.3 dB. This is due to the fact that the same code (39,5,19) is used for all types ranging from 32 to 17, and the target DER is achieved with no margin only for the user type 17, corresponding to a nominal SNR of 0 dB.

It is also possible to evaluate the performances of the described above examples, according to the present invention, in term of detection error rate DER with respect to a worst case design.

The worst case design provides a coding example where all users are able to decode all ACMI headers. A Reed-Muller code class is chosen as constituent code and its parameters will be evaluated as a function of the required signal to noise ratio SNR range and number of modes M.

In the worst case design, the fact that each user type i can be associated to a code with different code-word lengths or protection is not exploited. The code design is such that each user type i is capable to retrieve the ACMI from the header. Remembering that the user type i decides to proceed with decoding only if the detected $ACMI_j$ is less than or equal to its type, i.e., j≤i. In this case, the channel code generation is rather simple and strictly depends on the minimal signal to noise ratio SNR allowed in the system.

Taking the asymptotic expression of the DER $\epsilon$ for a code with minimum distance $d_{min}$, number of nearest neighbours A and repeating it R times, is achieved:

$$\epsilon = AQ\left(\sqrt{2 d_{min} R \cdot SNR}\right) \to R d_{min} = \frac{Q^{-1}(\epsilon/A)^2}{2 \cdot SNR} \qquad (7)$$

It is considered the class of Reed-Muller codes as a solution for worst case design. The Reed-Muller codes have the parameters (n=$2^m$, k=m+1), with $d_{min}=2^{m-1}$ and A=$2^k-2$.

Figure 12:
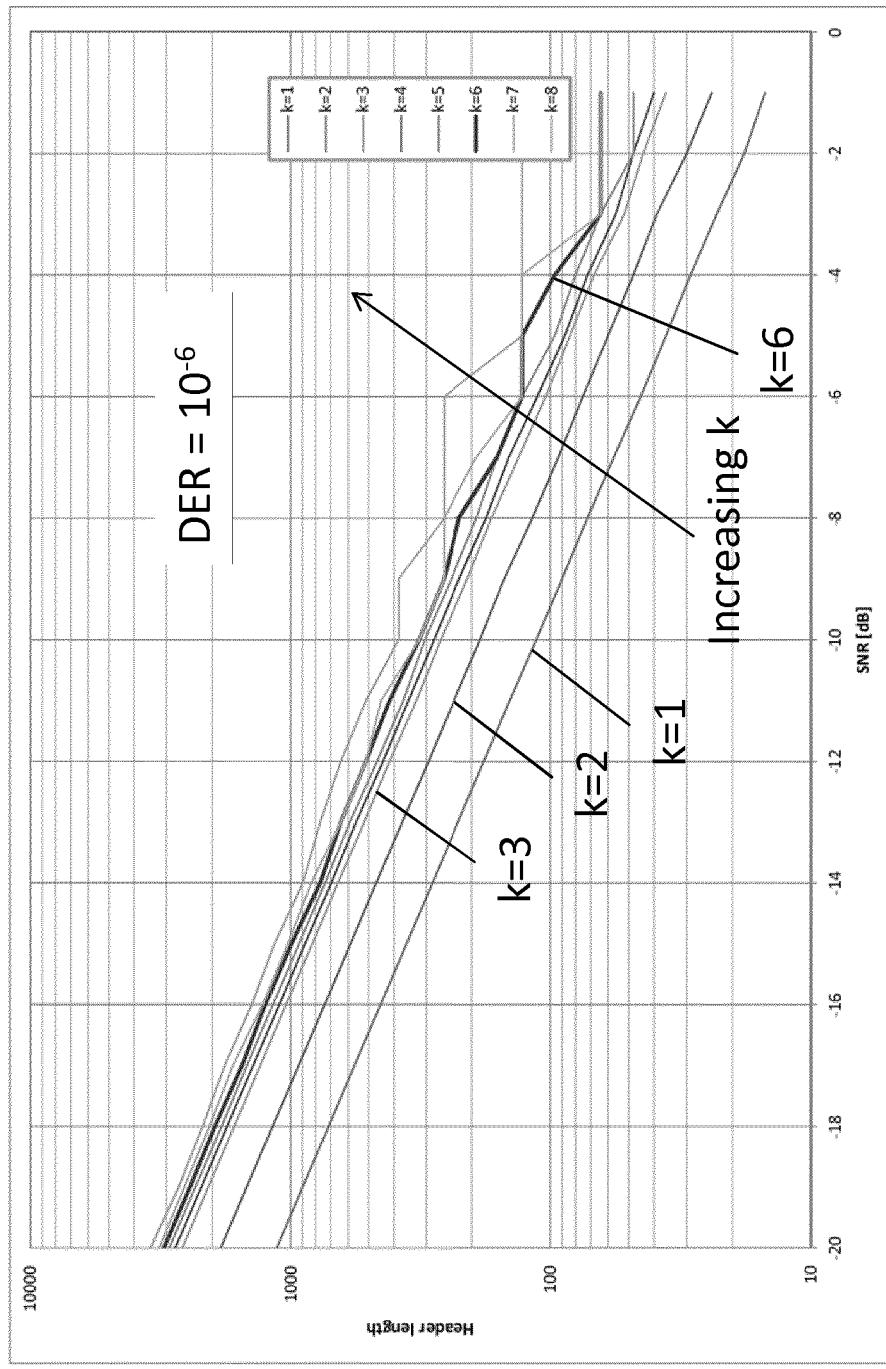

With reference to FIG. 12 and FIG. 13, there is reported the required header length Rn to achieve a DER $\epsilon$≤$10^{-6}$ versus the minimal target SNR. The different curves in FIG. 12 refer to the use of Reed-Muller codes with k=1 to 8. The number of the needed repetitions can be easily computed given the length of the corresponding Reed-Muller. The curve indicated with k=6 is the one that should be considered for a system with 64 ACM modes. It can be noticed that, in order to design a channel code working at −16 dB with 32 modes and DER $\epsilon=10^6$, a header length of 1168 (reference 131) is required with a worst case design, while the maximum header length of the examples of variable length coding according to the present invention described above is 464 (reference 51) shown in FIG. 5, using Hamming bound, and 609 (reference 61) shown in FIG. 6, using in our construction linear codes of the prior art.

Figure 14:
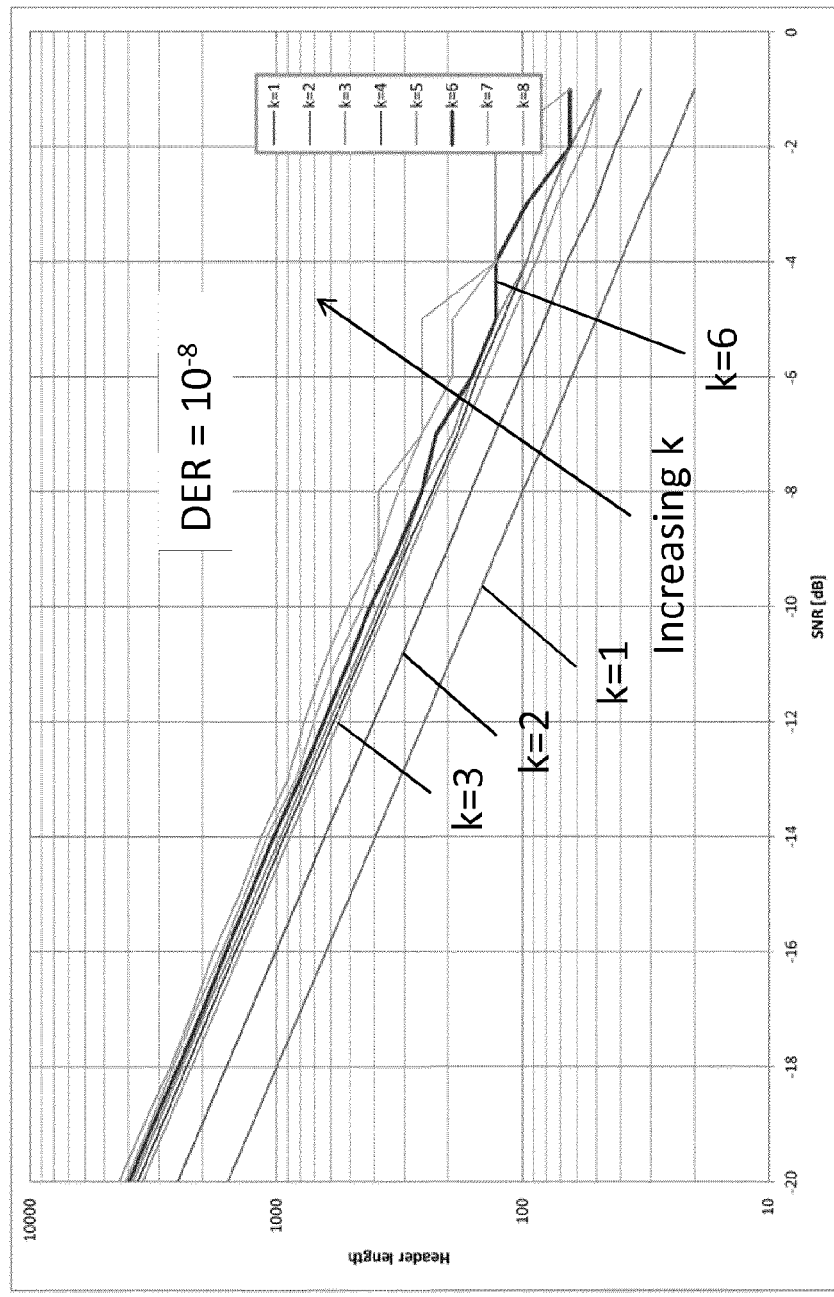

With reference to FIG. 14 and FIG. 15, there is reported the required header length Rn achieved setting a DER $\epsilon=10^{-8}$. In this latter case, the maximum header length at −16 dB with 32 modes and DER $\epsilon=10^{-8}$ is 1520 (reference 151), while the maximum header length of the examples of variable length coding of the present invention described above is 791 (reference 81) shown in FIG. 8.

It is clear from this comparison that the header length decreases when using the method according to the present invention.

With reference to FIG. 10, there are shown simulation results using a maximum likelihood decoder, i.e. to maximize the probability $P(\bar{y}|\bar{c})$. It is done by calculating the correlation of a received signal $\bar{y}$ with all the code-words of $\bar{c}$ code and then choosing the code-word with largest correlation. It is important to notice that the user type i needs to calculate the correlation between only the first N, elements of the received signal $\bar{y}$ and only for the i code-words associated to SNR's which are smaller or equal to its nominal SNR ($SNR_i$).

Therefore, the decoding complexity is different for each user type i and is equal to $N_i \times i$ sums and i comparisons. The average decoding complexity can be calculated as E{$N_i \times i$}. In FIGS. 5 to 9 the last column shows $N_i \times i$ results with their average values, assuming a uniform distribution over all the users.

Since in the examples described above the linear constituent codes are chosen to be optimal for the given parameters and no other particular structure is assumed, the best optimal decoding strategy is to compute the correlation of the received signal $\bar{y}$ ($N_i$ sums) with all the i candidate code-words.

The complexity of this exhaustive decoder is affordable because it is dealing with small codes and short average lengths.

The complexity of the correlations is further reduced by using constituent codes which admit faster decoding algorithms, as the Hadarmard transform used for Reed-Muller or maximal length codes. In particular, for a given set of parameters (n, k, d) where n and k are sufficiently small, repetition of maximal length codes yields codes with almost optimal performances.

The main goal of UEP ("Unequal Error Protection") is to design a code which offer a larger error protection to some bits, symbols or code-words than others. In the literature the same name is used for all three cases.

Hereinafter it is described a further example of the present invention, only addressing the code-word UEP, which uses a modification of the variable length channel code generation described above to generate a fixed length code.

The variable length code also has code-words with different error protection capabilities.

In fact, one way to generate a block UEP code is to extend all the code-words of the code obtained for variable length codes by zero to have a fixed length for all code-words (to equalize the length of all code-words), thus at least a code-word comprises a sequence of bits having values equal to zero. In this case all code-words will have the length equal to the longest code-word in the starting code.

It can be noticed that for this strategy to work, one should not use the all zero code-words in the construction of the starting variable length code.

It is important to notice that in the example of variable length coding described above it should be considered the average length as the effective length of the code.

As for the complexity of the maximum likelihood corr-elator decoder for the generated code by zero padding, it has in principle the same complexity as the corresponding variable length coding and therefore the aforementioned description about decoding complexity is valid also for these codes.

The features of the present invention, as well as the advantages thereof, are apparent from the above description.

A first advantage of the method for generating channel codes according to the present invention is that the average and the maximal length of a frame-header of a data packet is minimized.

A second advantage of the method of the present invention is that the spectral efficiency of a communication system is maximized.

A further advantage of the method of the present invention is that the correction capability of the generated channel code is improved.

A further advantage of the method of the present invention is that the computational complexity of a decoder is decreased.

A further advantage of the method of the present invention is to possibly also obtain a fixed length for all code-words in order to have a same complexity of the maximum likelihood decoder of a variable length code.

The method and the system for generating channel codes in particular for a frame-header described herein by way of example may be subject to many possible variations without departing from the novelty spirit of the inventive idea; it is also clear that in the practical implementation of the invention the illustrated details may have different shapes or be replaced with other technically equivalent elements.

For example, the method and the system for generating channel codes in particular for a frame-header can be applied in any communication system in which it is possible to vary the spectral efficiency and/or in communication systems that do not use an ACM scheme.

It can therefore be easily understood that the present invention is not limited to a method and a system for generating channel codes in particular for a frame-header, but may be subject to many modifications, improvements or replacements of equivalent parts and elements without departing from the inventive idea, as clearly specified in the following claims.

The invention claimed is:

1. A method for generating a channel code for a frame-header of a packet, the method comprising:
obtaining a code-word of said channel code, with an encoder, by means of at least a concatenation of code-words of two constituent codes, wherein said concatenation is performed on subsets of code-words of a first constituent code, having maximum length, with code-words of a second constituent code, wherein each of the first constituent code and the second constituent code is associated with a different signal to noise ratio; and
including the code-word of said channel code in the frame header.

2. The method according to claim 1, wherein said at least a code-word of said constituent codes is encapsulated into a code-word of said channel code.

3. The method according to claim 1, wherein said at least a code-word of said channel code has length greater than remaining code-words of said channel code.

4. The method according to claim 1, wherein a minimum distance of said constituent codes depends on signal to noise ratios, which are associated with user types and they are different from each said user type, and depends on a detection error rate.

5. The method according to claim 1, wherein said minimum distance is computed for each said user type.

6. The method according to claim 1, wherein a maximum code-word length of said channel code is obtained by the formula $N_i=\Sigma_{m=1}^{M}n_m$ where M is the maximum number of said code-words of said channel code corresponding to an highest said signal to noise ratio, m is an integer index varying from one to M and $n_m$ is a length of said code-word of said constituent code at index m.

7. The method according to claim 1, wherein said code-words of said channel code have variable length.

8. The method according to claim 1, wherein said constituent codes are known linear codes.

9. The method according to claim 1, wherein said at least a code-word of said channel code comprises a sequence of bits having values equal to zero to equalize the length of said at least a code-word.

10. The method according to claim 9, wherein said code-words of said channel code have fixed length.

11. The method according to claim 1, wherein said channel code is an UEP code.

12. The method according to claim 1, wherein said channel codes are suitable to be used for a frame-header of a data packet of a communication system.

13. A system for generating channel codes, comprising:
at least an encoder configured to generate a channel code for a frame-header, wherein at least a code-word of said channel code is obtained by means of at least a concatenation of code-words of two constituent codes and said concatenation is performed on subsets of code-words of a first constituent code, having maximum length, with code-words of a second constituent code, wherein each of the first constituent code and the second constituent code is associated with a different signal to noise ratio.

14. The system according to claim 13, wherein said encoder is suitable to be used in a communication system.

15. The system according to claim 14, wherein said communication system comprises a plurality of user types having different signal to noise ratios.

16. The system according to claim 14, wherein said communication system is an ACM ("Adaptive Coding and Modulation") communication system.

17. A method for generating a channel code for a frame header broadcast to users associated with different signal to noise ratios, the method comprising:

generating, with an encoder, a set of variable length code-words by concatenating a constituent code word from each of M codes, wherein a code-word for each mode i is obtained by concatenating code-words of constituent codes from M down to i; and encapsulating, by the encoder, a code word of constituent codes into a code-word of the channel code, wherein the concatenation of the code words of the channel code is performed on subsets of code-words or a first constituent code with code-words of at least a second constituent code, wherein each of the first constituent code and the second constituent code is associated with a different signal to noise ratio.

\* \* \* \* \*